United States Patent [19]

Jorke et al.

[11] Patent Number: 4,806,502
[45] Date of Patent: Feb. 21, 1989

[54] METHOD FOR DOPING SEMI-CONDUCTOR MATERIAL DURING EPITAXIAL GROWTH

[75] Inventors: Helmut Jorke, Gerstetten; Horst Kibbel, Erbach, both of Fed. Rep. of Germany

[73] Assignee: Licentia Patent-Verwaltungs-GmbH, Frankfurt am Main, Fed. Rep. of Germany

[21] Appl. No.: 133,252

[22] Filed: Dec. 9, 1987

Related U.S. Application Data

[63] Continuation of Ser. No. 800,414, Nov. 21, 1985, abandoned.

[30] Foreign Application Priority Data

Nov. 22, 1984 [DE] Fed. Rep. of Germany ....... 3442460

[51] Int. Cl.$^4$ ............................................. H01L 21/36
[52] U.S. Cl. .................................. 437/106; 437/107; 437/105; 437/108; 437/24; 437/82; 148/DIG. 169
[58] Field of Search ............... 437/105, 106, 107, 108, 437/24, 20, 18, 81, 82; 148/DIG. 169

[56] References Cited

U.S. PATENT DOCUMENTS

| 4,194,935 | 3/1980 | Dingle et al. ........................ 357/17 |
| 4,213,801 | 7/1980 | Johnston, Jr. . | |
| 4,529,455 | 7/1985 | Bean et al. ........................ 29/576 E |
| 4,579,609 | 4/1986 | Relf et al. ............................. 437/170 |
| 4,649,059 | 3/1987 | Eden et al. ........................... 437/107 |

FOREIGN PATENT DOCUMENTS

| 57-211724 | 12/1982 | Japan . |
| 58-67020 | 4/1983 | Japan . |

OTHER PUBLICATIONS

Goodwin et al., "Application of SiMBE . . . Diodes", IEEE Trans. on Electron Devices, vol. ED-26, #11, Nov. '79, pp. 1796-1799.
Daembkes et al, "Then-Channel SiGe/Si . . . Transistor", IEEE Trans. on Elect. Dev., vol. ED-33, #5, May '86, pp. 633-637.
Bean, J., "Arbitrary Doping Profiles . . . MBE", Appl. Phys. Lett., vol. 33, #7, Oct. 1, 1978, pp. 654-656.
Naganuma et al, "Ionized Znr Doping . . . Epitaxial Films", Appl. Phys. Lett., vol. 27, #6, 9/15/86, pp. 342-344.
Ota, Y. "n-Type Doping . . . Antimony Evaporation", J. Electrachem. Soc., vol. 126, #10, Oct. '79, pp. 1261-1265.
Becker et al, "Acceptor Dopants in Silicon Molecular Beam Epitaxy", J. Applied Physics, vol. 48, #8, Aug. 77, pp. 3395-3399.
Konig et al, "Si-MBe: Growth and Sb Doping", J. Vac. Sci. Tech., vol. 16, #4, Jul./Aug. 79, pp. 985-989.
Radiation Effects, "Epitaxial Growth of Silicon Assisted by Ion Implantation", T. Itoh et al, vol. 9, pp. 1-4 (1971).

Primary Examiner—Brian E. Hearn
Assistant Examiner—Kevin McAndrews
Attorney, Agent, or Firm—Spencer & Frank

[57] ABSTRACT

A method for producing a doped semiconductor layer on a semiconductor substrate, employing particle radiation, including the steps of initially applying an adsorbed layer containing a doping substance to the semiconductor substrate; controlling the concentration of the doping substance in the adsorbed layer; growing a semiconductor layer having a crystal lattice structure on the substrate; performing a secondary implantation operation for incorporating the doping substance in the crystal lattice of the semiconductor layer; and performing a heat treatment for removing crystal lattice imperfections and incorporating the doping substance into crystal lattice positions.

31 Claims, 3 Drawing Sheets

Schematic diagram of our MBE equipment. By means of an ionization ring on top of the Si source additional Si ions are generated.

Fig. 1    Schematic diagram of our MBE equipment. By means of an ionization ring on top of the Si source additional Si ions are generated.

Electron and Sb concentration profiles evaluated with spreading resistance and SIMS. The increase in the SIMS profile close to the surface is due to residual Sb adatoms.

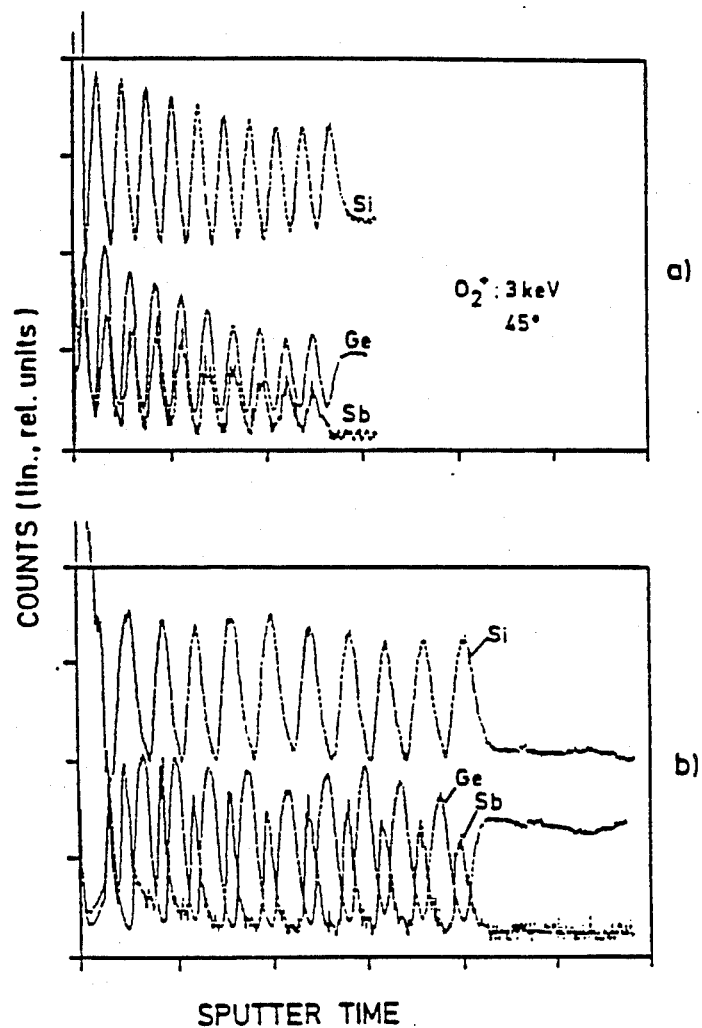
Fig. 3: SIMS signals for Si, Ge, and Sb (DSI technique). Substrate bias on with Ge shutter open (a) or closed (b).

METHOD FOR DOPING SEMI-CONDUCTOR MATERIAL DURING EPITAXIAL GROWTH

This application is a continuation of application Ser. No. 800,414, filed Nov. 21, 1985, now abandoned.

BACKGROUND OF THE INVENTION

The present invention relates to a method for doping semiconductor material employing particle radiation.

In the manufacture of semiconductor elements, e.g. transistors, it is necessary to dope only a thin layer of a semiconductor material, e.g. for the production of pn-junctions and/or connecting contacts. Such doping can be effected by means of low energy ion implantation into a growing molecular beam epitaxy (MBE) layer. For this purpose, the semiconductor material to be doped is exposed to particle radiation (corpuscular radiation) which contains the doping substance in an ionized state, e.g. ionized atoms and/or molecules. During passage through an electrical field, these ions receive high kinetic energy, e.g. approximately 500 eV, so that penetration of the ionized doping substance into the semiconductor material bombarded with it becomes possible.

Such a method has the drawback that it is uneconomical because it requires particularly cost ineffective devices to produce a certain doping profile in a repeatable manner.

SUMMARY OF THE INVENTION

It is therefore an object of the present invention to improve a method of this type so that it becomes possible to produce any desired given doping substance concentration profiles in a cost effective manner.

The above and other objects are achieved, according to the present invention, by a method for producing a doped semiconductor layer on a semiconductor substrate, employing particle radiation, which method includes:

initially applying an adsorbed layer containing a doping substance to the semiconductor substrate;

controlling the concentration of the doping substance in the adsorbed layer;

growing a semiconductor layer having a crystal lattice structure;

performing a secondary implantation operation for incorporating the doping substance in the crystal lattice of the semiconductor layer; and performing a heat treatment for removing crystal lattice imperfections and incorporating the doping substance into crystal lattice positions.

A first advantage of the invention is that it is possible to produce doped semiconductor layers whose layer thickness lies in the nm range. A second advantage is that it is possible, particularly if silicon wafers are coated by means of molecular beam epitaxy at low temperature, to produce an antimony (Sb) doped silicon (Si) semiconductor layer.

The invention will be described in greater detail below with reference to a preferred embodiment and the drawings.

BRIEF DESCRIPTION OF THE DRAWINGS

FIG. 3 shows the SIMS signals for a doped Si/SiGe superlattice produced by the method according to the invention.

DESCRIPTION OF THE PREFERRED EMBODIMENTS

In a molecular beam epitaxy (MBE) system, a monatomic adsorbed layer, e.g. of antimony or galluim, is initially applied to a semiconductor substrate, e.g. a silicon wafer having a diameter of approximately 100 mm and a thickness of approximately 0.5 mm. If, during an MBE process, this Sb adsorbed layer is now subjected, at a temperature of about 900K, to a particle stream of electrically neutral Si atoms and/or Si molecules, which were produced, for example, by heating a Si body, these Si atoms and/or Si molecules are deposited on the Si semiconductor substrate therebelow. An only slightly Sb doped epitaxial Si semiconductor layer results.

If, however, the Sb adsorbed layer is subjected, at a temperature of about 900K, to particle radiation of about 250 eV which additionally contains Si ions, a strongly Sb doped Si semiconductor layer surprisingly results. The resulting Sb concentration is about $10^{19}/cm^3$.

It has been found to be advantageous to support the incorporation of doping substance in the semiconductor layer by, simultaneously with and/or subsequent to exposure to particle radiation, heating the semiconductor layer to a temperature which permits healing of any crystal lattice imperfections. For silicon, for example, this temperature is about 1000K.

By selecting, for example, the thickness of the adsorbed layer and/or the duration of the ionized particle radiation, it is possible to set almost any desired given doping substance concentration profile in the semiconductor layer.

During the, for example, epitaxial growth of the semiconductor layer, the concentration of the doping substance in the adsorbed layer is controlled and/or regulated by a selection of the temperature of the semiconductor layer in such a way that the existing desorption of the doping substance become negligible; and/or by replenishing the doping substance, for example, by means of vapor deposition with the aid of an appropriate vapor-deposition source.

EXAMPLES

Figure 1:
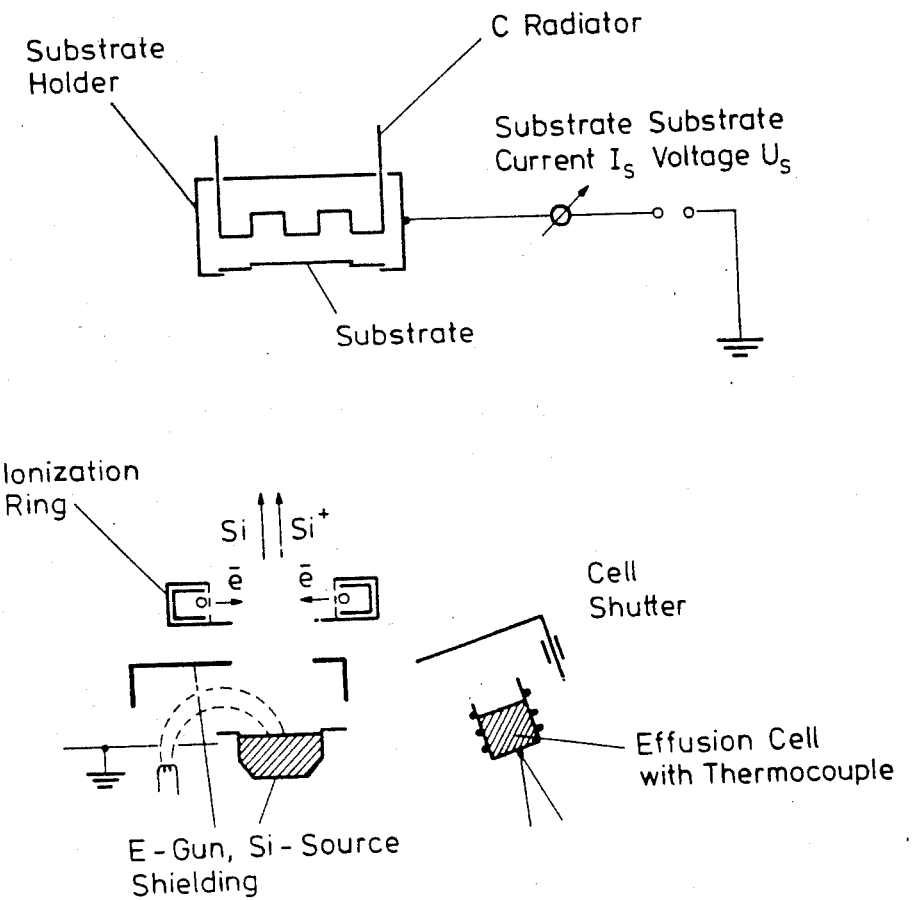
FIG. 1 is a schematic illustration of a molecular epitaxy apparatus used to carry out the method according to the invention.

Epitaxy is performed in a ultra high vacuum system pumped down by a turbomolecular pump, a titanium sublimation pump and a rotary pump down to about $10^{-10}$ mbar immediately before deposition. Layers are grown on standard 3-inch-diameter p-type (B) (100)-Si-substrates with a resistivity of 10+Ωcm. The substrates are heat cleaned for 5 min at a temperature of 1170K. In FIG. 1 the main components within the growth chamber are sketched. Si is evaporated out of an electron gun ($e^-$-gun) heated Si source, typically working at an acceleration voltage of 10 kV and an emission current of $I_E = 100$ mA.

Antimony, as the doping substance, is evaporated out of a resistance heated pyrolytic boron nitride crucible (PBN).

Si+ ions are produced as well in the e−-gun heated Si source within a cross beam ionization ring, which typically operates at an electron emission current of 100 mA and an electron energy of 200 eV. Equipment for applying a voltage of typically −500V between the Si source and the substrate is installed. Typical Si+ ion currents of 10 μA are obtained at a growth rate of 0.2 nm/s. The Si+ ion current is found to increase proportionally to the growth rate. Determination of the Si+ ion current is performed according to $$I_{ion} = I_S(I_E) - 3\,I_S(I_E/3) \quad (1)$$

with $I_S(I_E)$ being the substrate current at full emission current $I_E$ of the e−-gun and $I_S(I_E/3)$ being the substrate current at a third of the emission current. The contribution of electrons (backscattered and secondary electrons from the Si source) to the substrate current is assumed to be proportional to the e−-gun emission current $I_E$, whereas Si+ ions, which are proportional to the growth rate and therefore susceptible to the Si source temperature, are negligible at $I_E/3$.

The dependence of the applied antimony flux $j_{Sb}$ the Sb effusion cell temperature is determined by neutron activation analysis of coated Si substrates. The density of preadjusted Sb adlayers is calculated according to $$n_S = j_{Sb} \cdot t \quad (2)$$

with t being the pre-build-up time and $j_{Sb}$ the calibrated flux density, evaluated from effusion cell temperature.

1. Si nn+ graded layer

Figure 2:
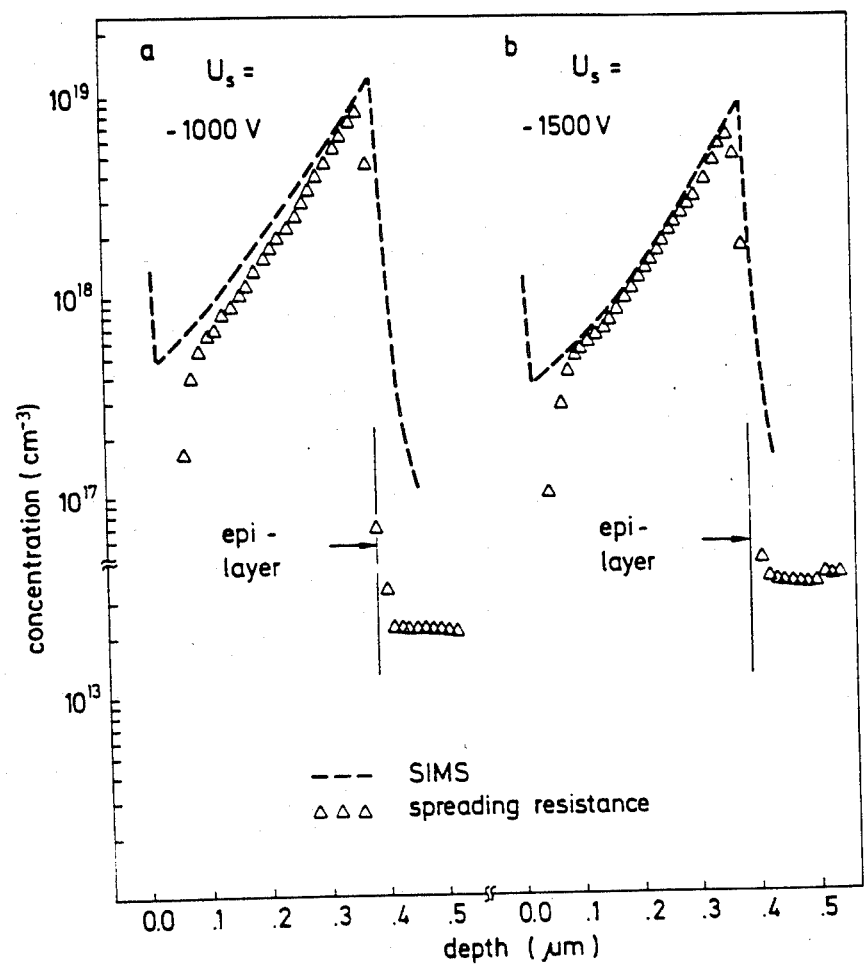
FIG. 2 shows the electron and antimony concentrations evaluated according to spreading resistances and SIMS according to one example of the method according to the invention for two different substrate voltages.

Prior to epitaxy, an Sb adlayer of $n_{S,0} = 1 \times 10^{14} \text{cm}^{-2}$ is preadjusted on the Si substrate by evaporation, calculated according to equation (2). Process parameters are an effusion cell temperature of $T_{Sb} = 648K$ and a pre-build-up time of t=40 s. The growth rate of the subsequently grown epitaxial Si layer, evaluated from layer thickness, amounts to 0.3 nm/s. Growth temperature is chosen be 923K. In FIGS. 2a and 2b the spreading resistance and secondary ion mass spectrometry (SIMS) profiles are shown, obtained with layers grown at −1000V and −1500V substrate voltage, respectively.

Because the Sb adlayer is not replenished during layer growth, it depletes, which results in a decrease of dopant bulk concentration.

Quantitative analysis of the dopant bulk concentration profile reveals almost complete incorporation. With corresponding layers grown in the absence of Si+ ions only low doping levels are observed. From the Si+ ion current data and the slope of the curves shown in FIG. 2a, the cross section of incorporation $o_I$ can be estimated to be $o_I = 5 \times 10^{-16} \text{cm}^2$.

2. Selectively doped Si/Si$_{1-x}$Ge$_x$ superlattice Prior to epitaxy an Sb adlayer of $n_{S,0} = 7.5 \times 10^{14} \text{cm}^{-2}$ is preadjusted on the Si substrate by evaporation, calculated according to equation (2). Process parameters are an effusion cell temperature of $T_{Sb} = 648K$ and a pre-build-up time of t=300 s. During heterostructure layer growth at $T_S = 873K$, germanium is coevaporated out of a resistance heated PBN crucible at a typical 1500K cell temperature, corresponding to a deposition rate of 0.03 nm/s. An initially 0.2 μm thick, undoped epitaxial Si$_{0.75}$Ge$_{0.25}$ buffer layer is grown at zero substrate voltage at 0.09 nm/s Si deposition rate. Subsequently, a 10 period 5.0 nm Si/5.0 nm Si$_{0.5}$Ge$_{0.5}$ multilayer is grown by appropriate handling of a Ge shutter at a Si deposition rate of 0.03 nm/s. At different samples a substrate voltage of −500V is applied in the middle of respective Si and Si$_{0.5}$Ge$_{0.5}$ layer for 36 s, leading to about 1 nm and 2 nm doping spikes in the respective Si and Si$_{0.5}$Ge$_{0.5}$ layers. From Shubnikov—de Haas measurements and/or Hall measurements a sheet dopant concentration of $4 \times 10^{12} \text{cm}^{-2}$ in each single layer is established, corresponding to a total sheet concentration of $4 \times 10^{13} \text{cm}^{-2}$. Hence depletion of the initial adlayer density is negligible, which is also confirmed by a vanishing decrease in Sb doping spike height, shown in FIG. 3.

It will be understood that the above description of the present invention is susceptible to various modifications, changes and adaptations, and the same are intended to be comprehended within the meaning and range of equivalents of the appended claims.

What is claimed is:

1. A method for producing a doped semiconductor layer on a semiconductor substrate employing particle radiation, the method comprising:
   (a) initially applying an adsorbed layer containing a doping substance of a desired concentration to the semiconductor substrate;
   (b) controlling the concentration of the doping substance in the adsorbed layer;
   (c) epitaxially growing a semiconductor layer having a crystal lattice structure on said semiconductor substrate;
   (d) during step (e), causing a secondary implantation operation for incorporating said doping substance into the crystal lattice structure of said semiconductor layer; and
   (e) performing a heat treatment for removing crystal lattice imperfections and incorporating the doping substance into crystal lattice positions of said semiconductor layer.

2. The method as defined in claim 1, wherein step (d) comprises directing particle radiation composed of neutral atoms, neutral molecules and accelerated ionized host lattice atoms of the substrate toward said substrate.

3. The method as defined in claim 2, wherein the particle radiation has an energy in the range of 10 to 10,000 eV.

4. The method as defined in claim 3, wherein the particle radiation has an energy in the range of 100 to 1000 eV.

5. The method as defined in claim 1, wherein step (d) comprises applying to the semiconductor layer particle radiation having an energy of 10 to 10,000 eV.

6. The method as defined in claim 5, wherein the particle radiation has an energy of 100 to 1000 eV.

7. The method as defined in claim 1, wherein the semiconductor layer is comprised of a semiconductor material, and wherein the semiconductor material and the doping substance are selected such that the adsorbed layer is maintained during step (c).

8. The method as defined in claim 1, wherein the substrate is of silicon and the doping substance includes at least one of antimony and gallium.

9. The method as defined in claim 1, wherein step (b) comprises controlling the temperature of the surface of the semiconductor layer during step (c).

10. The method as defined in claim 9, wherein step (b) further comprises replenishing the doping substance in the adsorbed layer during step (c).

11. The method as defined in claim 1, wherein step (b) comprises replenishing the doping substance in the adsorbed layer during step (c).

12. A method for producing a doped semiconductor layer on a semiconductor substrate employing particle radiation, the method comprising:
  (a) initially applying an adsorbed layer containing a doping substance of a desired concentration to the semiconductor substrate;
  (b) controlling the concentration of the doping substance in the adsorbed layer;
  (c) epitaxially growing a semiconductor layer having a crystal lattice structure on said semiconductor substrate;
  (d) during step (c), causing a secondary implantation operation for incorporating said doping substance into the crystal lattice structure of said semiconductor layer; and
  (e) performing a heat treatment for removing crystal lattice imperfections and incorporating the doping substance into crystal lattice positions of said semiconductor layer;
  wherein step (c) comprises a low temperature molecular beam epitaxy process employing a molecular beam; and
  wherein step (e) includes ionizing a portion of electrically neutral atoms and molecules in the molecular beam to produce positive ions of the host lattice atoms, and applying an accelerating potential to said substrate sufficient to cause said ions to interact with the atoms of said doping substance in said secondary implantation operation and cause said doping substance to be incorporated in the semiconductor layer to provide said doped semiconductor layer.

13. The method as defined in claim 12, wherein said positive ions of the host lattice atoms are accelerated to a kinetic energy of approximately 250 eV.

14. The method as defined in claim 13, wherein said substrate material is silicon and said adsorbed layer is a vapor deposited layer of at least one of antimony and gallium.

15. The method as defined in claim 14, wherein said semiconductor layer epitaxially grown in step (c) is a silicon layer.

16. The method as defined in claim 14, wherein said doped semiconductor layer is a superlattice of Si/SiGe.

17. The method as defined in claim 14, wherein said doping substance is antimony and the surface of said semiconductor layer epitaxially grown in step (c) is maintained at approximately 900K during step (c).

18. The method as defined in claim 1, wherein said adsorbed layer is a monatomic layer.

19. The method as defined in claim 12, wherein the semiconductor layer epitaxially grown in step (c) is maintained at approximately 900k during step (c).

20. The method as defined in claim 12, wherein the particle radiation has an energy in the range of 10 to 10,000 eV.

21. The method as defined in claim 20, wherein the particle radiation has an energy in the range of 100 to 1000 eV.

22. The method as defined in claim 12, wherein said adsorbed layer is a monatomic layer.

23. The method as defined in claim 12, wherein the semiconductor layer is comprised of a semiconductor material, and wherein the semiconductor material and the doping substance are selected such that the adsorbed layer is maintained during step (c).

24. The method as defined in claim 12, wherein step (b) comprises controlling the temperature of the surface of the semiconductor layer during step (c).

25. The method as defined in claim 24, wherein step (b) further comprises replenishing the doping substance in the adsorbed layer during step (c).

26. The method as defined in claim 12, wherein step (b) comprises replenishing the doping substance in the adsorbed layer during step (c).

27. The method as defined in claim 1, wherein the semiconductor layer epitaxially grown in step (c) is maintained at approximatly 900k during step (c).

28. The method for producing a doped semiconductor layer on a semiconductor substrate by employing particle radiation, the method comprising:
  (a) initially applying an adsorbed layer containing a doping substance of a desired concentration to the semiconductor substrate;
  (b) epitaxially growing a semiconductor layer having a lattice structure on the semiconductor substrate employing a molecular beam epitaxy process;
  (c) during step (b), causing a secondary implantation operation for incorporating the doping substance into the crystal lattice structure of the semiconductor layer, the secondary implantation operation comprising directing particle radiation composed of neutral atoms, neutral molecules, and accelarated ionized host lattice atoms of the substrate toward the substrate; and
  (d) performing a heat treatment for removing crystal lattice imperfections and incorporating the doping substance into the crystal lattice positions of the semiconductor layer.

29. The method defined in claim 28, comprising the further step of controlling the concentration of the doping substance in the adsorbed layer prior to step (b).

30. The method defined in claim 28, wherein the semiconductor layer epitaxially grown in step (b) is maintained at approximately 900k during step (b), and wherein step (c) comprises applying to the semiconductor layer particle radiation having an energy of 10 to 10,000 eV.

31. The method defined in claim 28, wherein said substrate material is silicon and said adsorbed layer is a vapor deposited layer of at least one of antimony and gallium.

* * * * *